United States Patent [19]
Aikoh et al.

[11] Patent Number: 5,532,999
[45] Date of Patent: Jul. 2, 1996

[54] OPTICAL DETECTOR HAVING STRAY CARRIER ABSORPTION REGIONS BETWEEN LIGHT RECEIVING ELEMENTS, AND AN OPTICAL HEAD USING THE SAME

[75] Inventors: Hideki Aikoh, Higashiosaka; Makoto Takashima, Ikoma; Hiroyuki Nakamura, Kobe; Tohru Nakamura, Katano, all of Japan

[73] Assignee: Matsushita Electric Industrial Co., Ltd., Kadoma, Japan

[21] Appl. No.: 263,549

[22] Filed: Jun. 22, 1994

[30] Foreign Application Priority Data

Jun. 25, 1993 [JP] Japan ................................. 5-154703

[51] Int. Cl.⁶ ..................................................... G11B 7/00
[52] U.S. Cl. ..................................... 369/120; 369/44.420
[58] Field of Search ............................... 369/44.41, 44.42, 369/120, 44.14, 110, 112, 120, 124; 250/214.1, 201.5; 257/436, 432, 437

[56] References Cited

U.S. PATENT DOCUMENTS

| 5,189,297 | 2/1993 | Ahlgren ................. 250/214.1 |
| 5,229,984 | 7/1993 | Konno et al. ............. 369/44.41 |
| 5,404,009 | 4/1995 | Kando et al. ............. 369/112 |
| 5,426,626 | 6/1995 | Katayama ................ 369/44.41 |

FOREIGN PATENT DOCUMENTS

| 0167357 | 1/1986 | European Pat. Off. . |
| 56-23788 | 3/1981 | Japan . |
| 61-214143 | 9/1986 | Japan . |
| 63-103448 | 5/1988 | Japan ................. 369/44.41 |
| 4205727 | 7/1992 | Japan . |
| 567340 | 3/1993 | Japan . |

*Primary Examiner*—Nabil Z. Hindi
*Attorney, Agent, or Firm*—Renner, Otto, Boisselle & Sklar

[57] ABSTRACT

An optical head includes: a light source for emitting light; first optical element for forming at least three light beams from the light emitted from the light source; second optical element for converging said at least three beams on a storage medium; and a photodetector for receiving said at least three beams reflected by the storage medium to generate electrical outputs in accordance with an intensity of the light beams, the photodetector including; a semiconductor substrate; a light receiving section formed on a surface of the semiconductor substrate for receiving the light beams reflected by the storage medium; a plurality of input terminals for receiving a supply of a predetermined potential; and a plurality of output terminals for outputting electric signals, wherein the light receiving section includes a plurality of light receiving elements for signal detection provided apart from each other on the surface of the semiconductor substrate and a plurality of stray light carrier absorption regions provided so as to substantially fill regions between the plurality of light receiving elements for signal detection, and wherein the plurality of stray light carrier absorption regions are made of first impurity diffusion regions of a first-conductivity type formed in the semiconductor substrate, the first impurity diffusion regions forming PN junctions and depletion layers in the semiconductor substrate so as to absorb stray light carriers generated in the semiconductor substrate by stray light.

22 Claims, 8 Drawing Sheets

OPTICAL DETECTOR HAVING STRAY CARRIER ABSORPTION REGIONS BETWEEN LIGHT RECEIVING ELEMENTS, AND AN OPTICAL HEAD USING THE SAME

BACKGROUND OF THE INVENTION

1. Field of the Invention

The present invention relates to an optical head and a photodetector used in an optical head. More specifically, the present invention relates to an optical head used in an optical information apparatus in which data is recorded, reproduced, and erased by using an optical beam such as a laser, and a photodetector used in such an optical head.

2. Description of the Related Art

An optical head, which is an important element of an optical information apparatus, is a device including means for focusing light on an optical information storage medium and a means for detecting light reflected from the optical information storage medium. FIG. 1 schematically shows a top face (a light detection face) of a photodetector used in a conventional optical head.

The photodetector 16, as shown in FIG. 1, has a plurality of light receiving regions for signal detection on a substrate and a plurality of terminals on the edge of the substrate. The substrate is made of a semiconductor, and the light receiving regions for signal detection are PN-type or PIN-type photodiodes formed in the semiconductor substrate. The predetermined voltage is applied to the photodiodes in a reverse direction. When the photodiodes are exposed to light, a photocurrent flows across the PN junctions of the photodiodes depending on the amount of the received light. The detection of the amount of the photocurrent makes it possible to obtain the amount of the received light. In order to operate the photodetector 16, it is necessary to supply a predetermined potential (voltage), for example, power level potential, reference level potential, ground level potential, and the like to each part of the semiconductor substrate. The power level voltage is supplied to cathode common terminals 17P1 and 17P2 to operate the photodetector 16 shown in FIG. 1.

In an optical head adopting a three-beam method, one of the beams emitted from a light source is diffracted by a diffraction element. Among the diffracted light beams formed by the diffraction element, a zero-order diffracted light beam is used as a main beam, and first-order and minus-first-order diffracted light beams are used as sub-beams for tracking. Among the three light beams formed in the optical head, the main beam forms an optical spot 18 in the middle of signal detection regions 16A, 16B, 16C, and 16D (four divided light receiving regions) of the photodetector 16, after the main beam is reflected by an optical disk. A focus error signal can be obtained from a differential signal between output signals of the diagonal regions of the signal detection regions 16A, 16B, 16C and 16D. More specifically, the focus error signal is obtained by the calculation of a known method based on output signals from anode terminals 17A, 17B, 17C, and 17D connected to the signal detection regions 16A, 16B, 16C, and 16D.

On the other hand, the two sub-beams form two sub-light spots 19A and 19B on the signal detection regions 16E and 16F, after the two sub-beams are reflected by the optical disk. A tracking error signal can be obtained from the differential signal between outputs of signal detection regions 16E and 16F. More specifically, the tracking error signal can be obtained by the calculation of a known method based on output signals from the anode terminals 17E and 17F.

Data signal recorded on the optical disk can be detected from a signal obtained by adding signals of the four divided receiving regions 16A, 16B, 16C, and 16D. More specifically, calculation is performed by a known method based on output signals from the anode terminals 17A, 17B, 17C, and 17D corresponding to the signal detection regions 16A, 16B, 16C, and 16D.

In the conventional photodetector 16 of the optical head as described above, in the case where stray light is generated in the optical head, stray light spots 20A and 20B are often formed in the peripheral area of the signal detection regions of the photodetector. Particularly, in the case of the optical head adopting the three-beam method, stray light frequently occurs. When stray light is irradiated on the peripheral area of the signal detection regions of the photodetector, the correct focus error signal, the tracking error signal, and the data signal cannot be stably obtained for the following reason.

When the stray light is irradiated on the semiconductor substrate of the photodetector 16, carriers (hereinafter, referred to as "stray light carriers") are generated in the semiconductor substrate. Even if the stray light carriers are generated in the region other than the signal detection regions, the stray light carriers diffuse in the semiconductor substrate to reach the vicinity of the signal detection region. When part of the stray light carriers reaches a depletion layer of the signal detection regions, the force from the electric field of the depletion layer forces the stray light carriers to flow into the signal detection region. As a result, a current flows through the photodiode of the signal detection regions. Thus, the current due to the stray light causes unnecessary signals. A case, for example, where the stray light spot 20A is formed at the position indicated in FIG. 1 is herein considered. The stray light carriers that are generated by the stray light spot 20A diffuse in all directions. However, the amount of stray light carriers flowing into the signal detection region 16A which is relatively near is larger than that flowing into the signal detection region 16C which is relatively far. As a result, for example, a correct focus error signal cannot be obtained. As described above, the occurrence of the stray light in the conventional optical head makes the stable detection of signals difficult.

SUMMARY OF THE INVENTION

The optical head according to the present invention includes: a light source for emitting light; first means for forming at least three light beams from the light emitted from the light source; second means for converging said at least three beams on a storage medium; and a photodetector for receiving said at least three beams reflected by the storage medium so as to generate electrical outputs in accordance with an intensity of the light beams, the photodetector including; a semiconductor substrate; a light receiving section formed on a surface of the semiconductor substrate for receiving the light beams reflected by the storage medium; a plurality of input terminals for receiving a supply of a predetermined potential; and a plurality of output terminals for outputting electric signals, wherein the light receiving section includes a plurality of light receiving elements for signal detection provided apart from each other on the surface of the semiconductor substrate and a plurality of stray light carrier absorption regions provided so as to substantially fill regions between the plurality of light receiving elements for signal detection, and wherein the plurality of stray light carrier absorption regions ere made of first impurity diffusion regions of a first-conductivity type formed in the semiconductor substrate, the first impurity diffusion regions forming PN junctions and depletion layers in the semiconductor substrate so as to absorb stray light carriers generated in the semiconductor substrate by stray light.

In one embodiment of the invention, the first impurity diffusion regions are electrically connected to the plurality of input terminals for receiving the supply of the predetermined potential, thereby applying a reverse-bias to the PN junctions.

In another embodiment of the invention, the first impurity diffusion regions of the stray light carrier absorption regions are electrically in a floating state.

In still another embodiment of the invention, the light receiving elements for signal detection are photo-diodes, each including a second impurity diffusion region of the first-conductivity type and a third impurity diffusion region of second-conductivity type formed in the semiconductor substrate, and the first impurity diffusion regions of the stray light carrier absorption regions have substantially the same characteristic as that of the second impurity diffusion region.

In still another embodiment of the invention, the plurality of light receiving elements are PIN-type photodiodes.

In still another embodiment of the invention, the photodetector includes an electric circuit in a peripheral area of the light receiving section of the semiconductor substrate.

In still another embodiment of the invention, anti-reflection means is formed on top faces of the stray light carrier absorption regions of the semiconductor substrate.

In still another embodiment of the invention, scattering means is formed on the top faces of the stray light carrier absorption regions of the semiconductor substrate.

In still another embodiment of the invention, the optical head further includes a circuit for detecting a photocurrent flowing across the PN junctions of the first impurity diffusion regions, wherein the optical head uses the photocurrent with output signals from the plurality of light receiving elements for signal detection so as to form signals.

In still another embodiment of the invention, part of the semiconductor substrate is electrically connected to a ground terminal among the plurality of input terminals and to the first impurity diffusion regions.

In still another embodiment of the invention, the first impurity diffusion regions are electrically connected to a selected terminal for a certain potential different from the ground potential among the plurality of input terminals.

In still another embodiment of the invention, each of the first impurity diffusion regions are electrically connected to another terminal and further connected to a power source line outside the photodetector through the other terminal.

According to another aspect of the invention, the photodetector used for an optical head includes: a semiconductor substrate; a light receiving section formed on a surface of the semiconductor substrate; a plurality of input terminals for receiving a supply of a predetermined potential; and a plurality of output terminals for outputting signals, wherein the light receiving section includes a plurality of light receiving elements for signal detection provided apart from each other on the surface of the semiconductor substrate, and a plurality of stray light carrier absorption regions provided so as to substantially fill regions between the plurality of light receiving elements for signal detection, and wherein the plurality of stray light carrier absorption regions are made of first impurity diffusion regions of a first-conductivity type formed in the semiconductor substrate, the first impurity diffusion regions forming PN junctions and depletion layers in the semiconductor substrate so as to absorb stray light carriers generated in the semiconductor substrate by stray light.

In another embodiment of the invention, the first impurity diffusion regions are electrically connected to the plurality of input terminals for receiving the supply of the predetermined potential, thereby applying a reverse bias to the PN junctions.

In still another embodiment of the invention, the first impurity diffusion regions of the stray light carrier absorption regions are electrically in a floating state.

In still another embodiment of the invention, the light receiving elements for signal detection are photodiodes, each including a second impurity diffusion region of the first-conductivity type and a third impurity diffusion region of a second-conductivity type, and the first impurity diffusion regions of the stray light carrier absorption regions have substantially the same characteristic as that of the second impurity diffusion region.

In still another embodiment of the invention, the plurality of light receiving elements for signal detection are PIN-type photodiodes.

In still another embodiment of the invention, the photodetector includes an electrical circuit in a peripheral area of the light receiving section of the semiconductor substrate.

In still another embodiment of the invention, anti-reflection means is formed on top faces of the stray light carrier absorption regions of the semiconductor substrate.

In still another embodiment of the invention, scattering means is formed on the top faces of the stray light carrier absorption regions of the semiconductor substrate.

In still another embodiment of the invention, part of the semiconductor substrate is electrically connected to a ground terminal among the plurality of input terminals and to the first impurity diffusion regions.

In still another embodiment of the invention, the first impurity diffusion regions are electrically connected to a selected terminal for a certain potential different from the ground potential among the plurality of input terminals.

In the optical head, at least three light beams are formed from light emitted from the light source. The light beams are converged on a storage medium and then reflected therefrom. The light beams reflected from the storage medium are irradiated on the photodetector to form a focus error signal, a tracking error signal and an data signal.

In the case where the stray light is generated in the optical head and irradiated on the light receiving section of the photodetector, the stray light carrier absorption regions provided so as to substantially fill gaps between the plurality of the light receiving elements for signal detection absorb the stray light carriers (carriers generated in the semiconductor substrate by the stray light). As a result, the stray light carriers are prevented from flowing into the light receiving elements for signal detection.

The mechanism that the stray light absorption regions absorb the stray light carriers is described as follows.

The stray light carrier absorption regions are the impurity diffusion regions formed in the semiconductor substrate and form the PN junctions in the semiconductor substrate. The forward bias is not applied to the PN junctions; the reverse bias is applied or no bias is applied to the PN junction. Thus, depletion layers are formed around the PN junctions. This means that the stray light carrier absorption regions have similar properties to those of a certain photodiode.

Since the stray light absorption regions are provided so as to substantially fill the regions between the plurality of the light receiving elements for signal detection, most of the stray light carriers are efficiently absorbed without diffusing to reach the neighboring light receiving elements for signal detection even if the stray light carriers are generated in the regions between the plurality of the light receiving elements for signal detection.

It is preferable that the reverse-bias is applied to the PN junctions of the stray light carrier absorption regions. To achieve this, it is preferable that the impurity diffusion regions of the stray light carrier absorption regions are connected to the portion (outside or inside the substrate) receiving the supply of the predetermined potential lower than the cathode potential.

Thus, the invention described herein has an objective to solve the above problems and makes possible an advantage of (1) providing an optical head which is excellent in signal detection characteristic for stably detecting a focus error signal, a tracking error signal, and an data signal as well as hardly influences each light receiving region for signal detection of a photodetector in the case of the occurrence of stray light in the optical head, and (2) providing a photodetector for the optical head.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples, with reference to the accompanying drawings.

EXAMPLE 1

Figure 1:
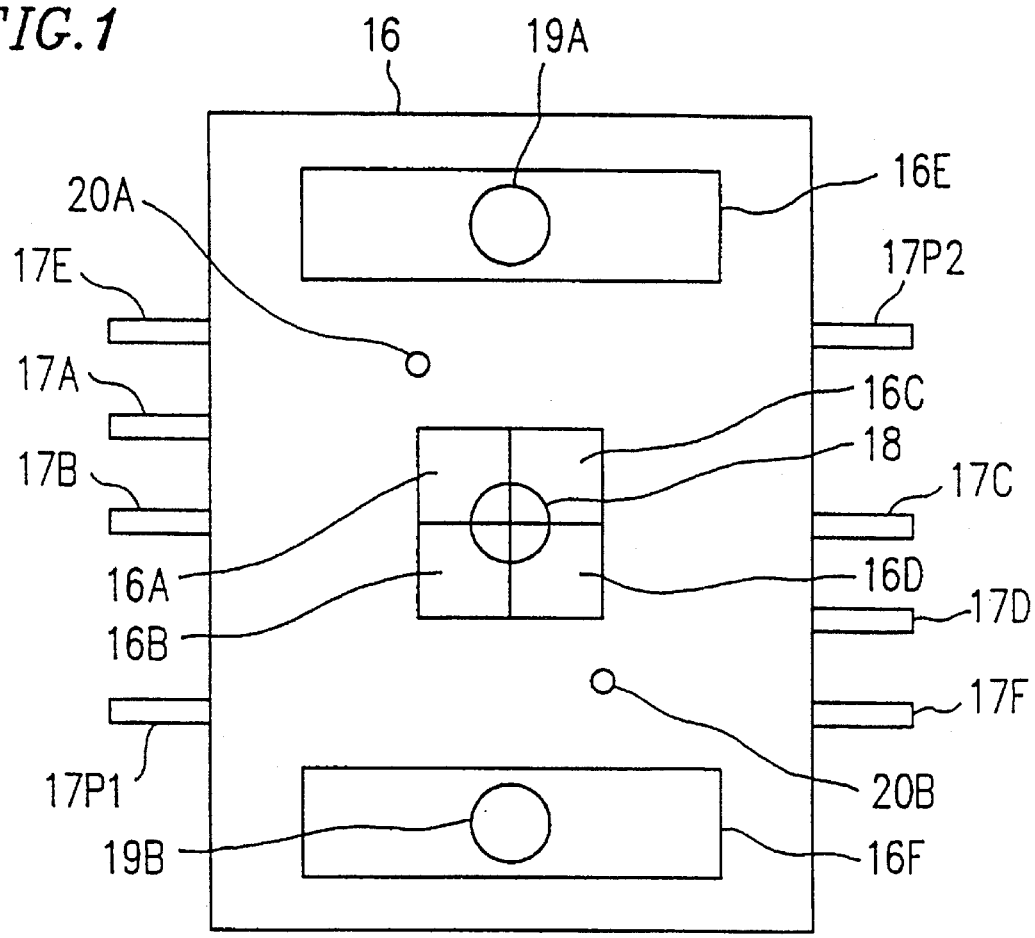
FIG. 1 is a plan view showing a configuration of a photodetector of a conventional optical head.
Figure 2:
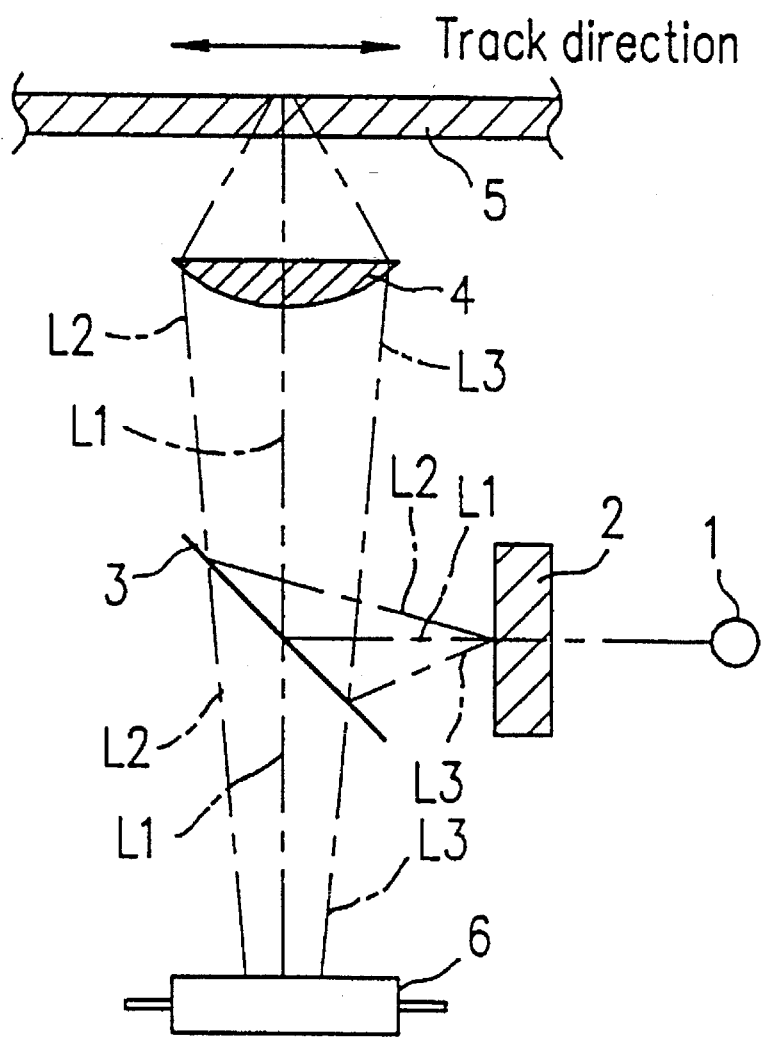
FIG. 2 schematically shows a configuration of an optical head according to the present invention.

FIG. 2 schematically shows a configuration of an optical head according to the present invention. The optical head of the present invention can be used in an information storage medium such as an optical disk in which data is recorded by pits, for example, a compact disk and the like.

As shown in FIG. 2, the optical head of the present invention includes: a semiconductor laser 1 which is a light source; a diffraction grating 2 for diffracting and splitting the light emitted from the semiconductor laser 1 into at least three light beams; a plate beam splitter 3 for reflecting the optical beams diffracted from the diffraction grating 2 to the side of an optical disk 5; an objective lens 4 for converging the light beams on the optical disk 5; and a photodetector 6 for receiving the light reflected from the optical disk 5 to convert the light into electric signals.

The configuration of the optical head according to the present invention is the same as that of the conventional optical head except the photodetector 6. Accordingly, while the configuration of the photodetector 6 will be described in detail, the other components are briefly described.

Figure 3:
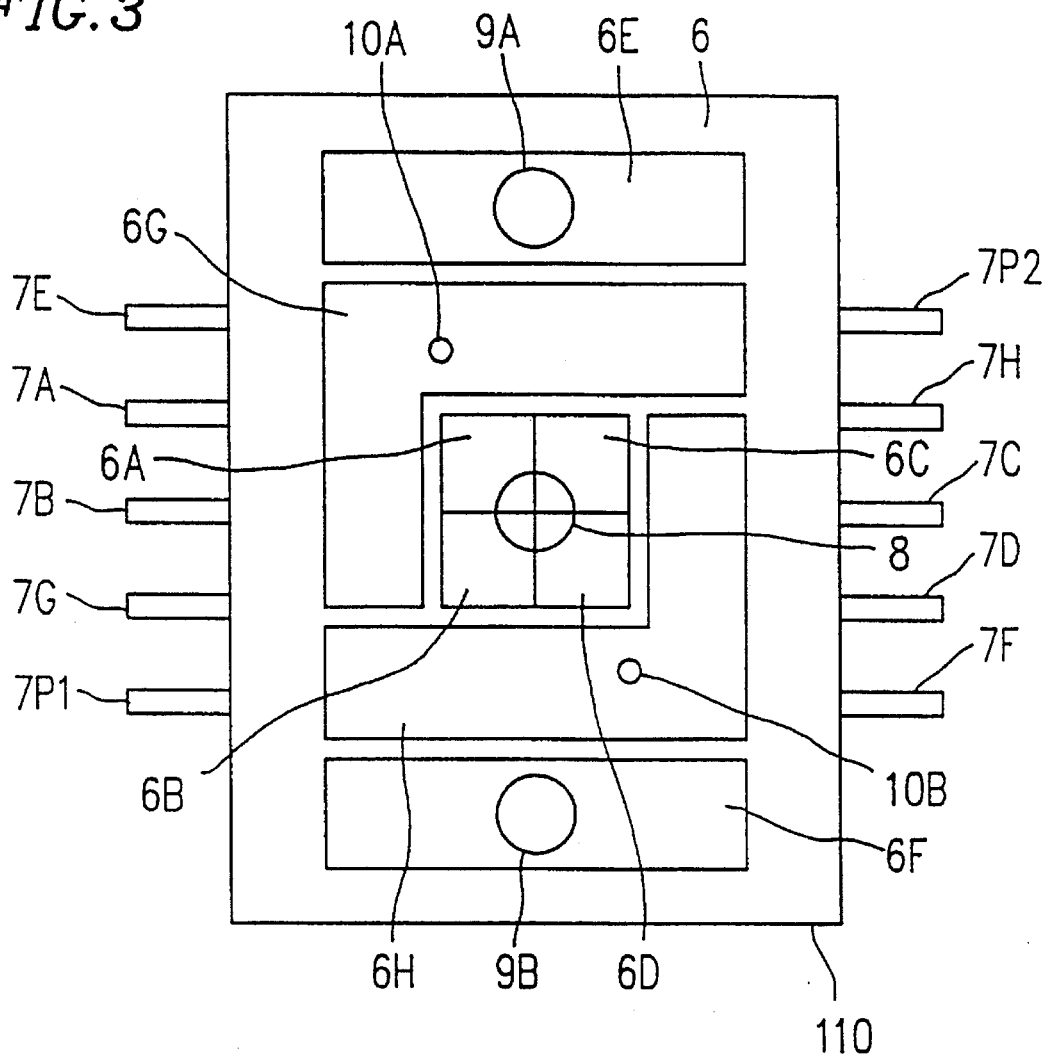
FIG. 3 is a plan view showing a configuration of a photodetector according to the present invention.

Hereinafter, the photodetector 6 is described. FIG. 3 schematically shows a plan layout of the photodetector 6. A light receiving section is provided on the top face of a semiconductor substrate 110. The light receiving section includes a plurality of signal detection regions 6A to 6F for receiving the light beams reflected from the optical disk 5. The signal detection regions 6A to 6F are impurity diffusion regions formed in the semiconductor substrate 110. Terminals 7A to 7H, 7P1 and 7P2 extend outside from the edge of the semiconductor substrate 110. The terminals 7A to 7F are connected to the signal detection regions 6A to 6F, respectively and function as anode terminals. The terminals 7P1 and 7P2 function as cathode common terminals for supplying source voltage to the photodetector 6.

On the light receiving section of the photodetector 6 of Example 1, stray light carrier absorption regions 6G and 6H are provided so as to surround the signal detection regions 6A to 6D. The stray light carrier absorption regions 6G and 6H expand to the main area of the region in the light receiving section on which the stray light may be irradiated as well as surround the signal detection regions 6A to 6D. The stray light carrier absorption regions 6G and 6H are regions having the same characteristic as that of the signal detection regions, i.e., impurity diffusion regions formed in the semiconductor substrate 110. In Example 1, the stray light carrier absorption regions 6G and 6H are connected to anode terminals 7G and 7H.

Figure 4:
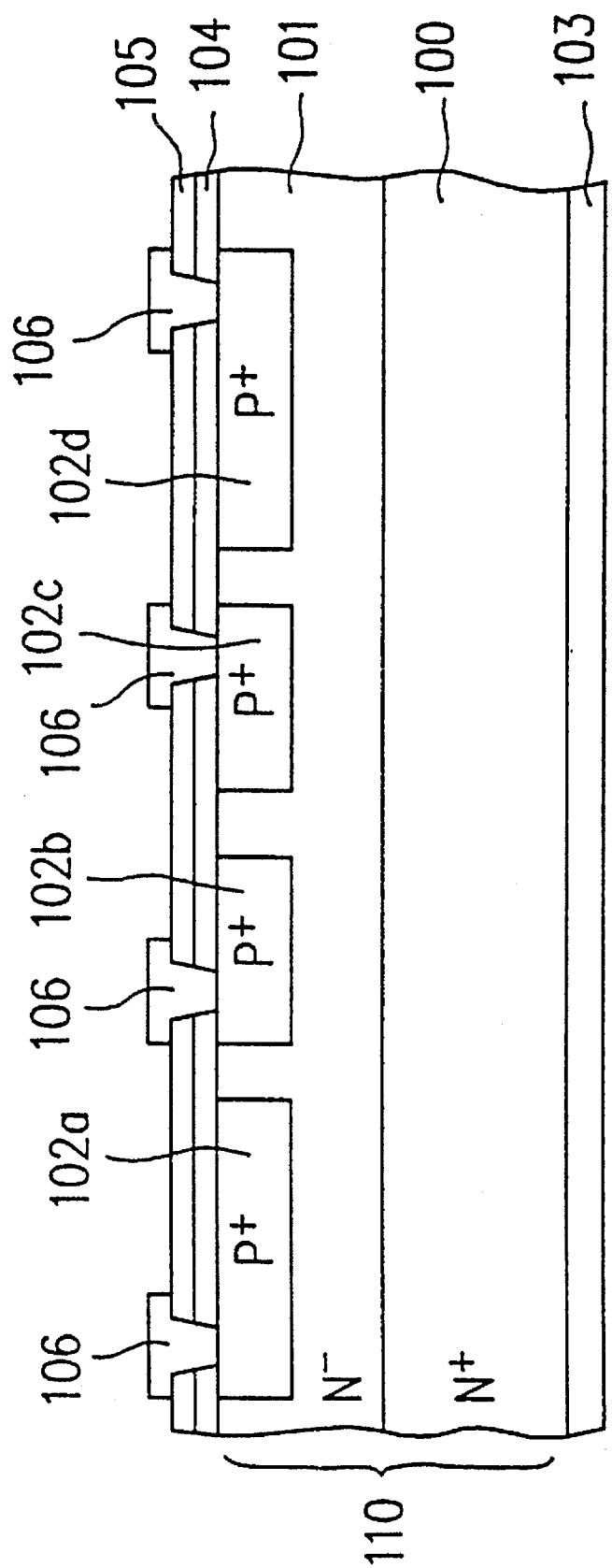
FIG. 4 is a sectional view showing a configuration of a photodetector according to the present invention.

FIG. 4 schematically shows a cross section of the photodetector 6. As shown in FIG. 4, the photodetector 6 has an $N^+$-type semiconductor layer 100 doped with N-type impurities at a relatively high concentration and an $N^-$-type semiconductor layer 101 (I layer) doped with N-type impurities at a relatively low concentration. Since the concentration of the impurities of the $N^-$-type semiconductor layer 101 is set to be sufficiently low, the $N^-$-type semiconductor layer 101 substantially functions as an intrinsic semiconductor having high electrical resistance. Herein, the $N^+$-type semiconductor layer 100 and the $N^-$-type semiconductor layer (I layer) 101 are referred to as the semiconductor substrate 110.

The $N^-$-type semiconductor layer 101 including a plurality of $P^+$-type impurity diffusion regions 102a, 102b, 102c, and 102d doped with P-type impurities at a relatively high concentration. The $P^+$-type impurity diffusion regions 102a to 102d correspond to the stray light carrier absorption region 6G, the signal detection regions 6A and 6C, and the stray light carrier absorption region 6H, respectively. The above configuration can be obtained, for example, by epitaxially growing the $N^-$-type semiconductor layer 101 on the $N^+$-type silicon substrate and then doping the appropriate P-type impurities in the $N^-$-type semiconductor layer 101 in a known manner. The P$^+$-type impurity diffusion regions 102a to 102d have similar doping profiles, so that the optical and electrical characteristics are substantially the same. Since the P$^+$-type impurity diffusion regions 102b and 102c are the signal detection region 6A and 6C, the kinds of the impurities and the doping profiles are designed so as to be optimized for the photoelectric conversion. From the fact that the P$^+$-type impurity diffusion regions 102a to 102d are formed so as to have similar profiles, it is suggested that the P$^+$-type impurity diffusion regions 102a and 102d can be simultaneously formed with the formation of the P$^+$-type impurity diffusion regions 102b and 102c.

A cathode electrode 103 is deposited on the bottom face (back face) of the semiconductor substrate 110 and connected to the cathode terminals 7P1 and 7P2 of FIG. 3. The top face of the semiconductor substrate 110 is covered with an insulation layer 104 and a protection layer 105 with a plurality of anode electrodes 106 provided thereon. The plurality of anode electrodes 106 are in contact with the P$^+$-type impurity diffusion regions 102a to 102d through contact holes formed in the insulation layer 104 and the protection layer 105, respectively. The anode electrode 106 is connected to a corresponding anode terminal (shown in FIG. 3).

As is apparent from the above description, vertical-type PIN diodes are formed between the cathode electrode 103 and the anode electrodes 106 of the photodetector 6. When the reverse bias is applied to each of the vertical-type PIN diodes by an electric circuit not shown in the figure, each of the vertical-type PIN diodes generates a photocurrent depending on the amount of the received light. The amount of the light irradiated on each of the signal detection regions (shown in FIG. 3) can be obtained by directly or indirectly detecting the photocurrent flowing through each of the vertical-type PIN diodes. After being converted into the voltage signals by the electric circuit (not shown in the drawing), the photocurrent flowing through the vertical-type PIN diodes is amplified and used for various calculations. Since the configurations and operations of such vertical-type PIN diodes and the above electric circuit are known, the detailed descriptions thereof are herein omitted.

The circuit for converting the photocurrent into the voltage signals, an amplifier circuit and a constant voltage supply and the like can be integrally formed in the photodetector. Circuit elements such as transistors and the like constituting the circuits are formed in the semiconductor substrate 110 employing a known integrated circuit technique, for example, a bipolar IC process. Although such an integrated photodetector can be called "a photo IC", it is referred to herein as "a photodetector containing electric circuits".

As shown in FIG. 4, the P$^+$-type impurity diffusion regions 102a and 102d (corresponding to the stray light carrier absorption regions 6G and 6H) are provided on the portions of the semiconductor substrate 110 of Example 1 on which stray light may be irradiated. The P$^+$-type impurity diffusion regions 102a and 102d as a whole surround the P$^+$-type impurity diffusion regions 102c and 102b (shown in FIG. 3). Like the P$^+$-type impurity diffusion regions 102c and 102b, the P$^+$-type impurity diffusion regions 102a and 102d of the stray light carrier absorption regions 6G and 6H form PN junctions in the semiconductor substrate 110, thereby forming a depletion layer in the vicinity of the PN junctions.

Part of the stray light, for example, 30% of the stray light irradiated on the P$^+$-type impurity diffusion regions 102a and 102d is reflected before being incident on the semiconductor substrate 110. The remainder (transmitted light) of the stray light which is not reflected enters the semiconductor substrate 110. In general, when the semiconductor absorbs the light, electron-hole pairs (carriers) are generated. The electrons generated by the stray light in the vicinity of the P$^+$-type impurity diffusion regions 102a and 102d move toward the N$^-$-type semiconductor layer 101 due to the electric field of the depletion layer across the PN junctions. Likewise, the holes move toward the P$^+$-type, impurity diffusion regions 102a or 102d. Namely, the P$^+$-type impurity diffusion regions 102a and 102d absorb the stray light carriers.

If the P$^+$-type impurity diffusion region 102a or 102d is in a floating state, the holes generated by the stray light in the vicinity of the PN junctions are temporarily stored in the P$^+$-type impurity diffusion region 102a or 102d and then recombined with the electrons thermally generated. On the other hand, if the anode electrode 106 (anode terminal 7G or 7H) connected to the P$^+$-type impurity diffusion region 102a or 102d is connected to a GND (ground terminal) outside the photodetector 6, the holes in the P$^+$-type impurity diffusion region 102a or 102d promptly flow into the GND.

In the case where the anode electrode 106 connected to the P$^+$-type impurity diffusion region 102a or 102d is further connected to the portion having the predetermined potential (potential lower than that of the cathode electrode 103) to apply the reverse-bias between the P$^+$-type impurity diffusion region 102a or 102d and the cathode electrode 103, the depletion layer in the vicinity of the PN junction between the P$^+$-type impurity diffusion region 102a or 102d and the N$^-$-type semiconductor layer 101 extends over a wide area, resulting in the larger depletion layer electric field. As a result, the carriers generated by the stray light are efficiently absorbed by the P$^+$-type impurity diffusion region 102a or 102d and the cathode electrode 103 at high probability. The holes in the P$^+$-type impurity diffusion region 102a or 102d promptly flow into the portion having the predetermined potential.

As described above, it is preferable that the reverse-bias is applied between the stray light carrier absorption regions 6G and 6H (P$^+$-type impurity diffusion regions 102a and 102d) in order to certainly capture the stray light carriers generated by the stray light. In addition, it is preferable that the stray light carrier absorption regions 6G and 6H, as shown in FIG. 3, are located so as to substantially cover the portion between the signal detection regions. In an example of FIG. 3, it can be seen that the regions around the signal detection regions 6A to 6D are not completely filled with one continuous stray light carrier absorption region. The reason why the stray light carrier absorption region consists of two separate parts is that the signal detection regions 6A to 6D can be easily connected with the anode terminals 7A to 7D.

Next, the operation of the optical head having the photodetector 6 shown in FIG. 3 is described with reference to FIG. 2. Light emitted from the semiconductor laser 1 which is a light source is diffracted by the diffraction grating 2, thereby forming at least three light beams. The resultant light beams are reflected by the plate beam splitter 3 and then travel toward the side of the optical desk 5. Thereafter, the light beams are focused on the optical disk 5 by the objective lens 4.

Among the three light beams, the central main beam (zero-order diffracted beam) is reflected from the optical disk 5 and then, as a ray L1, forms the optical spot 8 in the middle of the signal detection regions 6A to 6D (shown in FIG. 3) of the photodetector 6. The ray L1 causes astigmatism according to the fluctuation of the optical disk 5, whereby the focus error signal can be detected based on the differential signal between (6A+6D) and (6B+6C) of the four divided light receiving regions. More specifically, the focus error signal can be detected by calculating the levels of the output signals from the anode terminals 7A to 7D corresponding to the signal detection regions 6A to 6D.

On the other hand, the two light beams diffracted by the diffraction grating 2 (first-order diffracted beam and minus-first-order diffracted beam) ere reflected from the optical disk 5 and then, as rays L2 and L3, form light spots 9A and 9B on the signal detection regions 6E and 6F of the photodetector 6.

Since the optical head of Example 1 employs the three-beam method, the tracking error signal can be detected based on the differential signal between the signal detection regions 6E and 6F. More specifically, the tracking error signal can be detected by calculating the levels of the output signals from the anode terminals 7E and 7F corresponding to the signal detection regions 6E and 6F.

The reflection intensity of the main light beam is modulated by a plurality of pits formed on the optical disk 5. As a result, the amount of the light of the optical spot 8 on the photodetector 6 is changed. Then, the levels of the output signals from the four divided light receiving regions 6A to 6D of the signal detection regions are added, thereby reproducing the information recorded in the optical disk 5. More specifically, the data signal can be obtained by calculating the levels of the output signals from the anode terminals 7A and 7D corresponding to the signal detection regions 6A to 6D.

In the optical head, the stray light is generated, for example, due to double-reflection at the back face of the plate beam splitter 3 in the optical head. If the stray light is generated, the stray light is apt to form images on the peripheral area of each signal detection region of the photodetector 6. Particularly, in the case where the three beam method is employed as in Example 1, stray light is prone to be generated. More specifically, in the case of Example 1, the stray light spots 10A and 10B are prone to be formed on the stray light carrier absorption regions 6G and 6H of the photodetector 6 as shown in FIG. 3.

In Example 1, the stray light carrier absorption regions 6G and 6H are formed on the portion where the stray light spots 10A and 10B are prone to be formed. The impurity diffusion region of the stray light carrier absorption regions 6G and 6H efficiently capture and absorb the carriers generated by the stray light, preventing the stray light carriers generated in the photodetector 6 from flowing into the signal detection regions. As a result, unnecessary signals are prevented from being mixed with the focus error signal, the tracking error signal, and the data signal as noise, thereby realizing stable signal detection.

Figure 5:
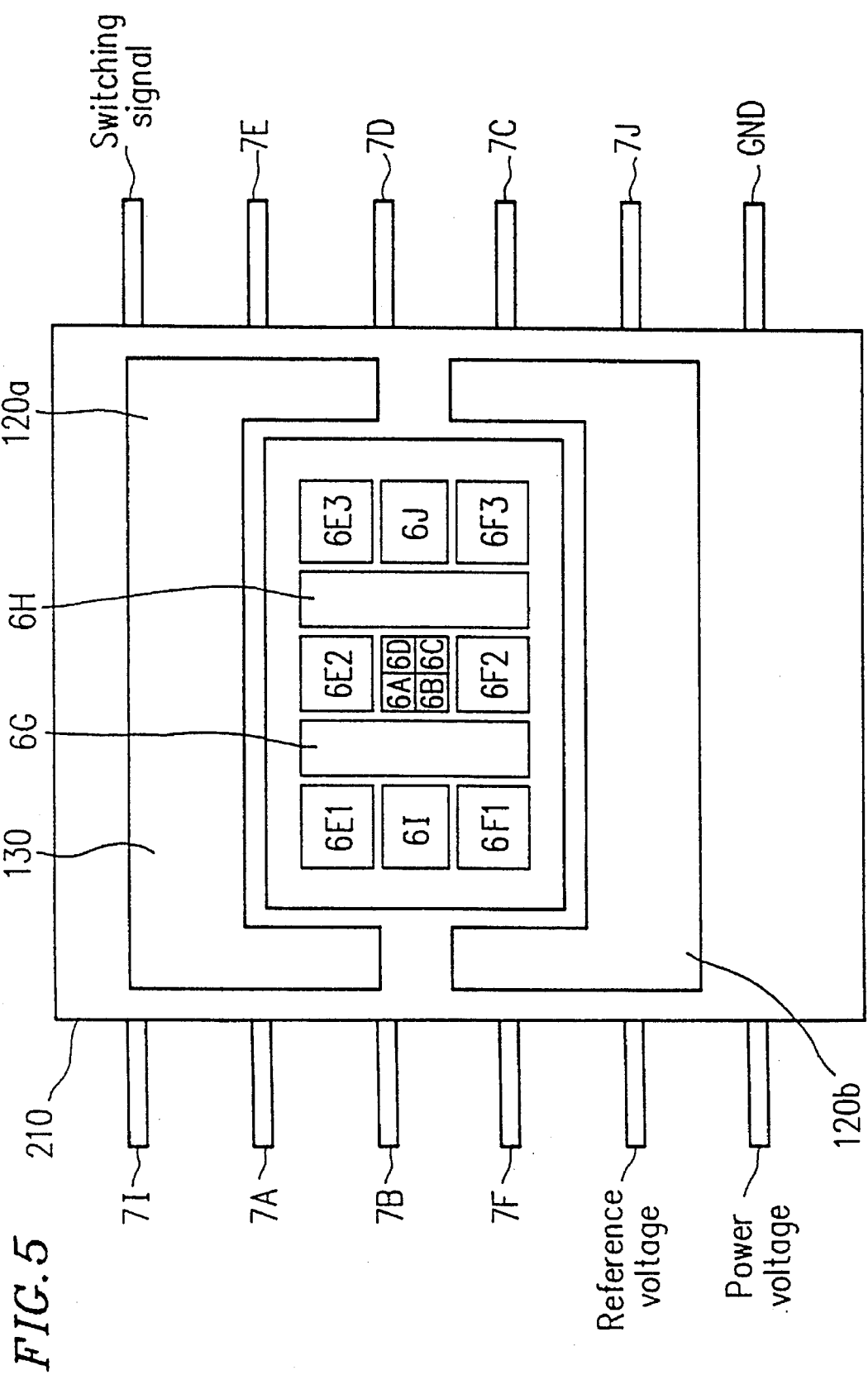
FIG. 5 is a plan view showing a configuration of another photodetector according to the present invention.

FIG. 5 schematically shows a plan layout of another photodetector according to the present invention. In the photodetector of Example 1, as shown in FIG. 5, a light receiving section 130 having the dimensions of 554 μm×866 μm (length×width) is surrounded by two peripheral electric circuit sections 120a and 120b. The light receiving section 130 and the peripheral electric circuit sections 120a and 120b are provided on a top face of a substrate 210 having the dimensions of 5 mm×4 mm (length×width). The peripheral electric circuit sections 120a and 120b include an amplifier for amplifying the electric signals obtained from the light receiving section 130 and the like. A plurality of terminals 7A to 7J extend toward the outside from the edge of the substrate 210. The terminals electrically connect an outside power supply, a control apparatus, and the like to the photodetector. As terminals, a power supply voltage terminal for supplying the power supply voltage to the internal electric circuits, a reference voltage terminal for supplying the reference voltage, and a ground (GND) terminal are also provided.

In the photodetector shown in FIG. 5, the peripheral electric circuit sections 120a and 120b and the light receiving section 130 are integrated on the substrate 210 formed of single-crystalline silicon as one unit. The photodetector of FIG. 5 is different from the photodetector 6 of FIG. 3 in the following points:

(1) The photodetector of this example contains the electric circuits therein.

(2) The signal detection regions 6E and 6F are divided into three regions 6E1, 6E2, and 6E3 and 6F1, 6F2, and 6F3, respectively.

(3) The signal detection regions 6I and 6J for detecting P-polarized light and S-polarized light are provided.

(4) The stray light carrier absorption regions 6G and 6H have a straight strip-like shape.

Referring to FIG. 5, the size of each region is described. Each of the signal detection regions 6A, 6B, 6C, and 6D is about 80 μm×about 80 μm in size. There are gaps of about 5 μm between the regions. Each of the signal detection regions 6E1 to 6E3 is approximately the same as the sum of the four signal detection regions 6A to 6D in size. The distance between the signal detection region 6A and 6E2 is about 20 μm. On the other hand, the distance between the signal detection region 6A and 6G is about 150 μm. The stray light carrier absorption region 6G has the dimensions of about 130 μm×about 550 μm (width×length). Although the stray light carrier absorption region 6G (6H) should be disposed so as to fill the gaps between the signal detection regions, it is unnecessary to form the stray light carrier absorption region in the relatively narrow region, for example, the region between the signal detection regions 6A and 6E2.

The stray light carrier absorption regions 6G and 6H of the photodetector, thereby being connected to a ground region provided in the semiconductor substrate 210 constituting the photodetector to be electrically connected to the ground terminal (GND). According to Example 1, it is not required to ground specific anode terminals for the stray light carrier absorption regions 6G and 6H outside the photodetector. Since it is unnecessary to provide specific anode terminals for the stray light carrier absorption regions 6G and 6H, the total number of the terminals used for the photodetector can be reduced. In the case of the photodetector containing electric circuits which has, for example, current-voltage conversion means therein, the number of the terminals used for the photodetector is often limited. In such a case, as in the photodetector of FIG. 5, it is preferable that the stray light carrier absorption regions 6G and 6H are connected to the portion having the predetermined potential in the substrate, thereby reducing the total number of the terminals used for the photodetector.

Figure 6:
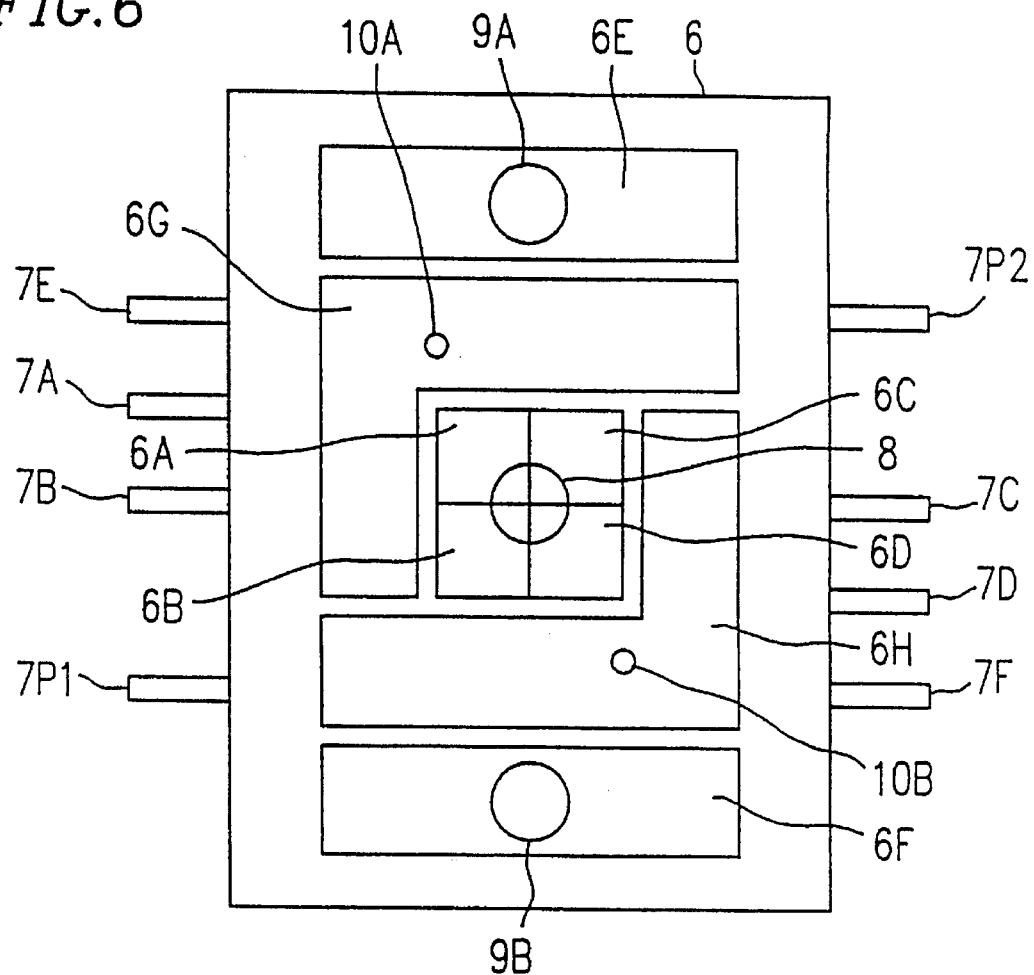
FIG. 6 is a plan view showing a configuration of still another photodetector according to the present invention.

FIG. 6 shows still another photodetector according to the present invention. In the case of the photodetector shown in FIG. 6, the stray light carrier absorption regions 6G and 6H are not connected to any terminals, that is, in the floating state. Although the stray light carrier absorption regions 6G and 6H are in the floating state, a relatively thin depletion layer is formed due to built-in potential. Therefore, the carriers generated by the stray light can be absorbed to a certain degree. However, it is preferable that a high reverse-bias is applied to the PN junction of the stray light carrier absorption regions 6G and 6H in order to expand the depletion layer and efficiently capture the stray light carriers.

EXAMPLE 2

Another optical head according to the present invention is described. The optical head except for the photodetector has the same configuration as that of the optical head shown in FIG. 2.

Figure 7:
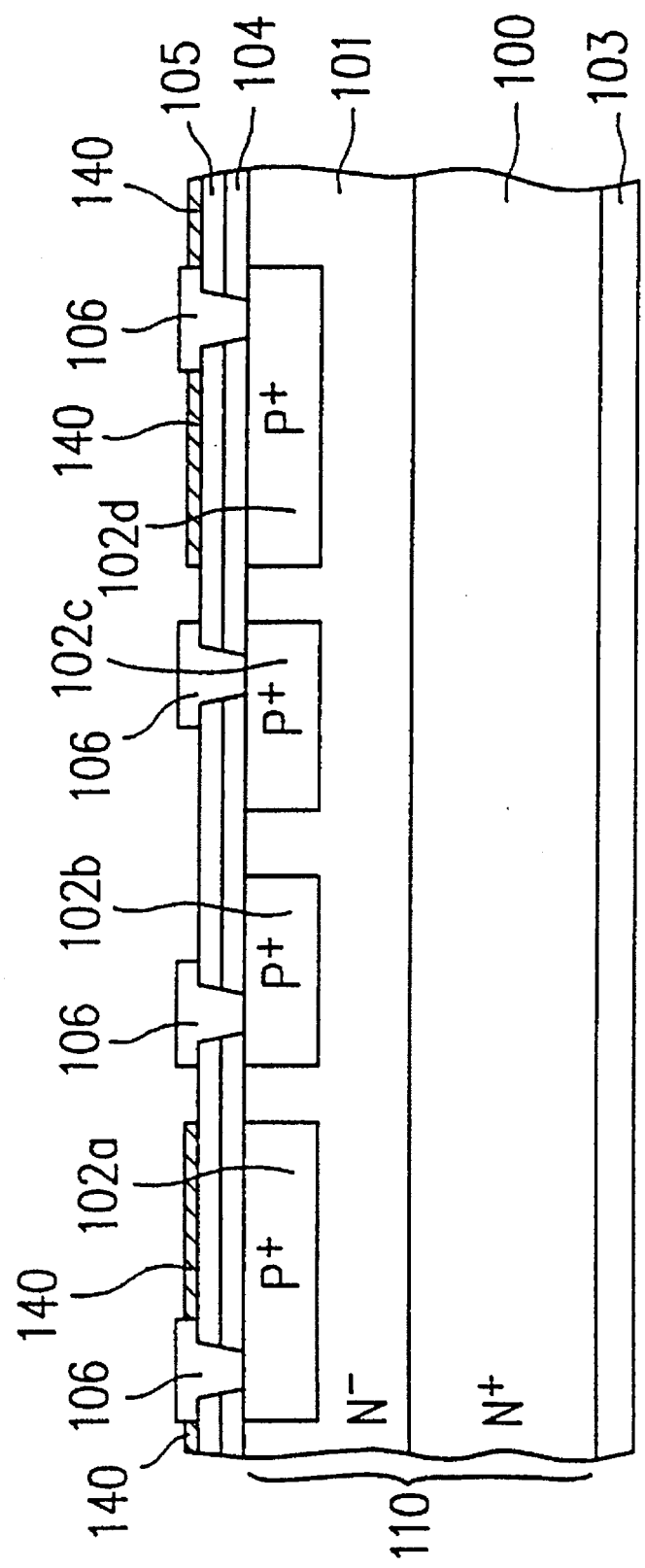
FIG. 7 is a sectional view showing a configuration of still another photodetector according to the present invention.

In the preceding example, the stray light carrier absorption regions 6G and 6H have the identical characteristic as that of the signal detection regions. In Example 2, however, the stray light carrier absorption regions 6G and 6H have different characteristics from that of the signal detection regions. More specifically, a multi-layer anti-reflection film 140 is provided on the stray light absorption regions 6G and 6H. In FIG. 7, components corresponding to the components of the photodetector shown in FIG. 4 are indicated by the same reference numbers.

According to Example 2, the amount of the stray light reflected from the surface of the substrate is further reduced, thereby decreasing the disadvantageous effects due to the reflection of the stray light on the surface of the substrate. Although the anti-reflection layer leads most of the stray light into the substrate, the stray light is absorbed (photoelectrically converted) in the substrate of the stray light carrier absorption regions 6G and 6H, thereby reducing the noise produced by scattering.

EXAMPLE 3

Still another optical head according to the present invention is described. The optical head except for the photodetector has the same configuration as that of the optical head shown in FIG. 2.

Figure 8:
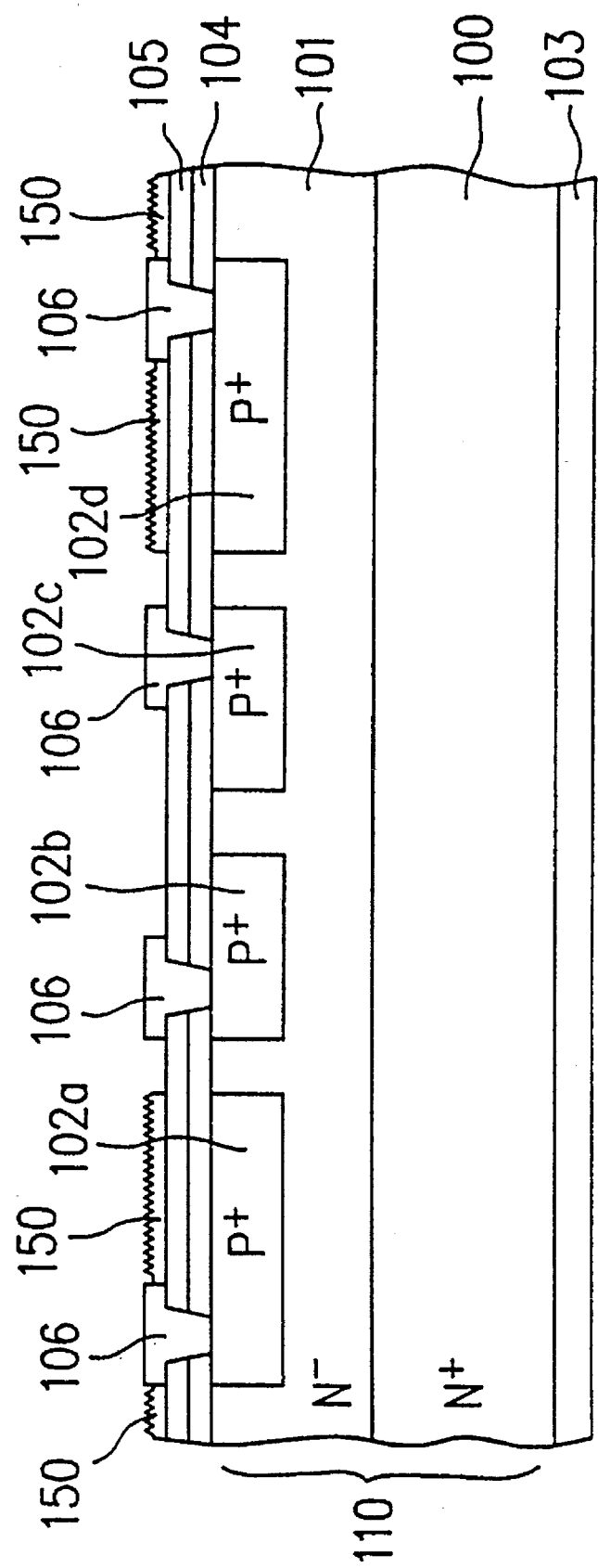
FIG. 8 is a sectional view showing a configuration of still another photodetector according to the present invention.

In the preceding example, the stray light carrier absorption regions 6G and 6H have the identical characteristic as that of the signal detection regions. In Example 3, however, the stray light carrier absorption regions 6G and 6H have different characteristics from that of the signal detection regions. More specifically, a scattering reflection film 150 is provided on the stray light absorption regions 6G and 6H. FIG. 8 shows a cross section of the principal part of the optical head. In FIG. 8, components corresponding to the components of the photodetector shown in FIG. 4 are indicated by the same reference numbers.

According to Example 3, most of the stray light is reflected in random directions from the surface of the substrate. As a result, the reflected stray light is almost uniformly incident on the signal light receiving regions. As a result, the amount of the light incident on each signal light receiving region is remarkably reduced, causing little noise due to the stray light. According to Example 3, the problem that the stray light is reflected from the surface of the substrate to be incident on the specific signal light-receiving regions is solved. The amount of the stray light entering the inside of the substrate is absorbed (photoelectrically converted) in the substrate of the stray light carrier absorption regions 6G and 6H, thereby reducing the noise produced by scattering.

In the case of Example 3, if the percentage of the stray light entering the inside of the substrate can be sufficiently reduced by the scattering reflection of the surface of the substrate, the problem caused by the stray carriers in the substrate has little importance. In addition, there is a possibility of requiring no impurity diffusion region provided for the stray light carrier absorption regions 6G and 6H. If the percentage of light scattered and reflected is sufficiently increased, it is unnecessary to diffuse impurities in the stray light carrier absorption regions 6G and 6H, thereby simplifying the manufacturing process. In such a case, it is also unnecessary to provide specific terminals for the stray light carrier absorption regions 6G and 6H and connections for connecting the stray light carrier absorption regions 6G and 6H to the terminals.

In all of the preceding examples, although the stray light carrier absorption region consists of two parts 6G and 6H, the number of the stray light carrier absorption regions is not limited. However, in order to efficiently connect the light receiving regions for detecting signals to the peripheral electric circuits, it is not preferable that one continuous stray light carrier absorption region is disposed so as to completely surround the light receiving regions for detecting signals.

In the case of the present invention, it is preferable to provide the stray light absorption regions 6G and 6H as wide as possible on the regions where the stray light carriers are likely to be generated. If there is not enough space between the signal detection regions, it is difficult to form the impurity diffusion region in such a small region. Thus, it is unnecessary to provide the stray light carrier absorption regions 6G and 6H.

As mentioned above, the present invention is described in connection with the optical disk for reproduction-only such as a compact disk. However, the present invention can also be applied to a magneto-optical disk, a phase-change disk, or a write-once disk. Moreover, the focus error detection method and the tracking error detection method can be optionally selected by any known method.

According to the present invention, in the case where the stray light is generated by the internal reflection of the optical device in the optical head, since the stray light carrier absorption regions are formed on the region of the photodetector where the stray light spots may be formed, it is possible to prevent the stray light carriers from entering each signal detection region to generate unnecessary signals. As a result, an optical head hardly influencing each light receiving region for detecting signals and capable of stably detecting the focus error signal, the tracking error signals and the data signal can be realized.

Various other modifications will be apparent to and can be readily made by those skilled in the art without departing from the scope and spirit of this invention. Accordingly, it As not intended that the scope of the claims appended hereto be limited to the description as set forth herein, but rather that the claims be broadly construed.

What is claimed is:

1. An optical head comprising:

a light source for emitting light;

first means for forming at least three light beams from the light emitted from the light source;

second means for converging said at least three beams on a storage medium; and a photodetector for receiving said at least three beams reflected by the storage medium so as to generate electrical outputs in accordance with an intensity of the light beams, the photodetector comprising;

a semiconductor substrate;

a light receiving section formed on a surface of the semiconductor substrate for receiving the light beams reflected by the storage medium;

a plurality of input terminals for receiving a supply of a predetermined potential; and a plurality of output terminals for outputting electric signals, wherein the light receiving section includes a plurality of light receiving elements for signal detection provided apart from each other on the surface of the semiconductor substrate and a plurality of stray light carrier absorption regions provided so as to substantially fill regions between the plurality of light receiving elements for signal detection, the plurality of stray light carrier absorption regions are made of first impurity diffusion regions of a first-conductivity type formed in the semiconductor substrate, the first impurity diffusion regions forming PN junctions and depletion layers in the semiconductor substrate so as to absorb stray light carriers generated in the semiconductor substrate by stray light, and the first impurity diffusion regions are electrically connected to the plurality of input terminals for receiving the supply of the predetermined potential, thereby applying a reverse-bias to the PN junctions.

2. An optical head comprising:

a light source for emitting light;

first means for forming at least three light beams from the light emitted from the light source;

second means for converging said at least three beams on a storage medium; and a photodetector for receiving said at least three beams reflected by the storage medium so as to generate electrical outputs in accordance with an intensity of the light beams, the photodetector comprising;

a semiconductor substrate;

a light receiving section formed on a surface of the semiconductor substrate for receiving the light beams reflected by the storage medium;

a plurality of input terminals for receiving a supply of a predetermined potential; and a plurality of output terminals for outputting electric signals, wherein the light receiving section includes a plurality of light receiving elements for signal detection provided apart from each other on the surface of the semiconductor substrate and a plurality of stray light carrier absorption regions provided so as to substantially fill regions between the plurality of light receiving elements for signal detection, the plurality of stray light carrier absorption regions are made of first impurity diffusion regions of a first-conductivity type formed in the semiconductor substrate, the first impurity diffusion regions forming PN junctions and depletion layers in the semiconductor substrate so as to absorb stray light carriers generated in the semiconductor substrate by stray light, and the first impurity diffusion regions of the stray light carrier absorption regions are electrically in a floating state.

3. An optical head according to claim 1, wherein the light receiving elements for signal detection are photo-diodes, each including a second impurity diffusion region of the first-conductivity type and a third impurity diffusion region of second-conductivity type formed in the semiconductor substrate, and the first impurity diffusion regions of the stray light carrier absorption regions have substantially the same characteristic as that of the second impurity diffusion region.

4. An optical head according to claim 3, wherein the plurality of light receiving elements are PIN-type photodiodes.

5. An optical head according to claim 1, wherein the photodetector includes an electric circuit in a peripheral area of the light receiving section of the semiconductor substrate.

6. An optical head according to claim 1, wherein anti-reflection means is formed on top faces of the stray light carrier absorption regions of the semiconductor substrate.

7. An optical head according to claim 1, wherein scattering means is formed on the top faces of the stray light carrier absorption regions of the semiconductor substrate.

8. An optical head according to claim 1 further comprising a circuit for detecting a photocurrent flowing across the PN junctions of the first impurity diffusion regions, wherein the optical head uses the photocurrent with output signals from the plurality of light receiving elements for signal detection so as to form signals.

9. An optical head according to claim 1, wherein part of the semiconductor substrate is electrically connected to a ground terminal among the plurality of input terminals and to the first impurity diffusion regions.

10. An optical head according to claim 1, wherein the first impurity diffusion regions are electrically connected to a selected terminal for a certain potential different from the ground potential among the plurality of input terminals.

11. An optical head according to claim 1, wherein each of the first impurity diffusion regions are electrically connected to another terminal and further connected to a power source line outside the photodetector through the another terminal.

12. A photodetector used for an optical head comprising:

a semiconductor substrate;

a light receiving section formed on a surface of the semiconductor substrate;

a plurality of input terminals for receiving a supply of a predetermined potential; and a plurality of output terminals for outputting signals, wherein the light receiving section includes a plurality of light receiving elements for signal detection provided apart from each other on the surface of the semiconductor substrate and a plurality of stray light carrier absorption regions provided so as to substantially fill regions between the plurality of light receiving elements for signal detection, the plurality of stray light carrier absorption regions are made of first impurity diffusion regions of a first-conductivity type formed in the semiconductor substrate, the first impurity diffusion regions forming PN junctions and depletion layers in the semiconductor substrate so as to absorb stray light carriers generated in the semiconductor substrate by stray light, and the first impurity diffusion regions are electrically connected to the plurality of input terminals for receiving the supply of the predetermined potential, thereby applying a reverse bias to the PN junctions.

13. A photodetector used for an optical head, comprising:

a semiconductor substrate;

a light receiving section formed on a surface of the semiconductor substrate;

a plurality of input terminals for receiving a supply of a predetermined potential; and a plurality of output terminals for outputting signals, wherein the light receiving section includes a plurality of light receiving elements for signal detection provided apart from each other on the surface of the semiconductor substrate and a plurality of stray light carrier absorption regions provided so as to substantially fill regions between the plurality of light receiving elements for signal detection, the plurality of stray light carrier absorption regions are made of first impurity diffusion regions of a first-conductivity type formed in the semiconductor substrate, the first impurity diffusion regions forming PN junctions and depletion layers in the semiconductor substrate so as to absorb stray light carriers generated in the semiconductor substrate by stray light, and the first impurity diffusion regions of the stray light carrier absorption regions are electrically in a floating state.

14. A photodetector according to claim 12, wherein the light receiving elements for signal detection are photodiodes, each including a second impurity diffusion region of the first-conductivity type and a third impurity diffusion region of a second-conductivity type, and the first impurity diffusion regions of the stray light carrier absorption regions have substantially the same characteristics as that of the second impurity diffusion region.

15. A photodetector according to claim 14, wherein the plurality of light receiving elements for signal detection are PIN-type photodiodes.

16. A photodetector according to claim 12 including an electrical circuit in a peripheral area of the light receiving section of the semiconductor substrate.

17. A photodetector according to claim 12, wherein anti-reflection means is formed on top faces of the stray light carrier absorption regions of the semiconductor substrate.

18. A photodetector according to claim 12, wherein scattering means is formed on the top faces of the stray light carrier absorption regions of the semiconductor substrate.

19. A photodetector according to claim 12, wherein part of the semiconductor substrate is electrically connected to a ground terminal among the plurality of input terminals and to the first impurity diffusion regions.

20. A photodetector according to claim 12, wherein the first impurity diffusion regions are electrically connected to a selected terminal for a certain potential different from the ground potential among the plurality of input terminals.

21. An optical head according to claim 6, wherein the anti-reflection means comprises an anti-reflection film.

22. A photodetector according to claim 17, wherein the anti-reflection means comprises an anti-reflection film.

* * * * *

UNITED STATES PATENT AND TRADEMARK OFFICE
CERTIFICATE OF CORRECTION

PATENT NO. : 5,532,999
DATED : July 2, 1996
INVENTOR(S) : Hideki Aikoh; Makoto Takashima; Hiroyuki Nakamura; Tohru Nakamura It is certified that error appears in the above-indentified patent and that said Letters Patent is hereby corrected as shown below:

On the title page, item [54] and column 1, line 1,
In the title, insert --LIGHT-- after "STRAY".

Signed and Sealed this

Thirteenth Day of May, 1997

Attest:

BRUCE LEHMAN

Attesting Officer    Commissioner of Patents and Trademarks